(12) United States Patent
Bauert et al.

(10) Patent No.: US 12,364,979 B2
(45) Date of Patent: Jul. 22, 2025

(54) FLUID LINE PART FOR A MICROFLUIDIC DEVICE, MICROFLUIDIC DEVICE, AND METHOD FOR PRODUCING A MICROFLUIDIC DEVICE

(71) Applicant: IMT AG, Greifensee (CH)

(72) Inventors: Tobias Bauert, Rikon im Tösstal (CH); Anke Sanz-Velasco, Baden (CH)

(73) Assignee: IMT AG, Greifensee (CH)

( * ) Notice: Subject to any disclaimer, the term of this patent is extended or adjusted under 35 U.S.C. 154(b) by 845 days.

(21) Appl. No.: 17/617,726

(22) PCT Filed: May 13, 2020

(86) PCT No.: PCT/EP2020/063274
§ 371 (c)(1),
(2) Date: Dec. 9, 2021

(87) PCT Pub. No.: WO2020/249348
PCT Pub. Date: Dec. 17, 2020

(65) Prior Publication Data
US 2022/0250059 A1    Aug. 11, 2022

(30) Foreign Application Priority Data
Jun. 14, 2019 (EP) .................................... 19180300

(51) Int. Cl.
*B01L 3/00* (2006.01)
*B01F 33/302* (2022.01)
(Continued)

(52) U.S. Cl.
CPC . *B01L 3/502707* (2013.01); *B01L 2200/0689* (2013.01); *B01L 2200/12* (2013.01); *B01L 2200/141* (2013.01); *B32B 37/12* (2013.01)

(58) Field of Classification Search
CPC ....... B01L 3/502707; B01L 2200/0689; B01L 2200/12; B01L 2200/141;
(Continued)

(56) References Cited

U.S. PATENT DOCUMENTS 6,533,914 B1 * 3/2003 Liu ................... B01L 3/502715
204/603
8,647,465 B2   2/2014 Chartier
(Continued)

FOREIGN PATENT DOCUMENTS

| DE | 19927533 A1 | 1/2001 |
|----|-------------|--------|
| DE | 10056908 A1 | 5/2002 |

OTHER PUBLICATIONS

International Report on Patentability issued in corresponding International Application No. PCT/EP2022/063274, dated Dec. 14, 2021, pp. 1-18, with English translation.
(Continued)

*Primary Examiner* — Jennifer Wecker
*Assistant Examiner* — Oyeleye Alexander Alabi
(74) *Attorney, Agent, or Firm* — Carter, DeLuca & Farrell LLP

(57) ABSTRACT

A fluid line part for a microfluidic device includes a first substrate having a first surface in which at least one depression is provided, the depression forming a channel for conducting a fluid along a main flow direction. At least one support web extends lengthwise inside the channel along the main flow direction. The support web is configured and positioned such that fluid flows freely around it.

22 Claims, 4 Drawing Sheets

(51) Int. Cl.
| | | |
|---|---|---|
| *B01F 33/3033* | (2022.01) | |
| *B01L 7/00* | (2006.01) | |
| *B01L 9/00* | (2006.01) | |
| *B23D 63/00* | (2006.01) | |
| *B29C 37/00* | (2006.01) | |
| *B32B 37/12* | (2006.01) | |
| *B65G 47/80* | (2006.01) | |
| *B82Y 15/00* | (2011.01) | |
| *B82Y 20/00* | (2011.01) | |
| *B82Y 30/00* | (2011.01) | |
| *B82Y 40/00* | (2011.01) | |
| *C12M 1/34* | (2006.01) | |
| *C12M 3/06* | (2006.01) | |
| *C12N 1/14* | (2006.01) | |
| *C12N 1/20* | (2006.01) | |
| *C12Q 1/02* | (2006.01) | |
| *C12Q 1/6806* | (2018.01) | |
| *C12Q 1/6844* | (2018.01) | |
| *C12Q 1/6848* | (2018.01) | |
| *C12Q 1/686* | (2018.01) | |
| *C23C 2/00* | (2006.01) | |
| *G01N 1/40* | (2006.01) | |
| *G01N 15/10* | (2024.01) | |
| *G01N 15/14* | (2024.01) | |
| *G01N 15/1433* | (2024.01) | |
| *G01N 21/29* | (2006.01) | |
| *G01N 21/41* | (2006.01) | |
| *G01N 21/45* | (2006.01) | |
| *G01N 21/65* | (2006.01) | |
| *G01N 27/04* | (2006.01) | |
| *G01N 27/12* | (2006.01) | |
| *G01N 33/00* | (2006.01) | |
| *G01N 33/543* | (2006.01) | |
| *G01N 33/574* | (2006.01) | |
| *G01N 33/58* | (2006.01) | |
| *G02B 6/42* | (2006.01) | |

(58) Field of Classification Search
CPC ..... B01L 2300/0816; B01L 2300/0864; B01L 2300/0867; B01L 2300/0887; B32B 37/12; B81C 1/00119; B81C 2203/032; B81B 2201/058; B81B 2203/0338
See application file for complete search history.

(56) References Cited

U.S. PATENT DOCUMENTS

| | | |
|---|---|---|
| 2004/0031558 A1 | 2/2004 | Matthias |
| 2005/0229696 A1* | 10/2005 | Takayama ........... B01F 25/4338 73/204.26 |
| 2013/0084629 A1 | 4/2013 | Nakazawa |

OTHER PUBLICATIONS

International Search Report issued in corresponding International Application No. PCT/EP2020/063274 dated Oct. 7, 2020, pp. 1-3, English Translation.

* cited by examiner

FLUID LINE PART FOR A MICROFLUIDIC DEVICE, MICROFLUIDIC DEVICE, AND METHOD FOR PRODUCING A MICROFLUIDIC DEVICE

FIELD OF THE INVENTION

The present invention relates to a fluid line part for a microfluidic device, a microfluidic device having such a fluid line part, and a method for producing a microfluidic device.

BACKGROUND INFORMATION

Microfluidic devices are designed to hold and/or conduct fluids, in particular liquids, in structures such as cavities and channels, which at least regionally have dimensions in the micrometer range (such as a few micrometers and up to some hundred micrometers). For example, microfluidic devices in the form of what are referred to as 'lab-on-a-chip' systems are used for medical or, in general, biotechnology applications. In addition, it is conventional to use microfluidic devices in so-called 'flow cells' for diagnostic purposes, for instance, and especially for DNA sequencing.

SUMMARY

A fluid line part is to be understood as a component for a microfluidic device which provides at least one channel for conducting a fluid. In at least one dimension (e.g., a channel depth), the channel has dimensions in the micrometer range that range from a few micrometers to a few hundred micrometers, for instance. However, it should be noted that such a fluid line part does not necessarily have to be microstructured in the sense that all dimensions of the channels provided therein need to be in the micrometer range; instead, a channel formed in a fluid line part may have a channel depth in the micrometer range (e.g., up to 100 μm), whereas a channel depth and/or a channel length may be in the millimeter or even centimeter range.

Such a fluid line part includes a first substrate having a first surface in which at least one depression is provided, the at least one depression forming a channel for conducting a fluid along a main flow direction.

Such a fluid line part is usually sealed at the top by a sealing part in order to form a microfluidic device. The at least one channel is sealed at the top in a partly fluid-tight manner, in particular.

Expressions such as 'at the top', 'upper', 'on', 'at the bottom, 'lower', etc. are simply relative indications that denote spatial relationships between different components in a specified reference system; they do not specify any absolute orientation in space.

For instance, the fluid line part and/or the sealing part may be provided on a wafer (e.g., made from glass or silicon). In this case, the two wafers are able to be bonded on top of each other by what is referred to as 'adhesive bonding' so that the sealing part seals the channel in the fluid line part at the top. That is to say, in adhesive bonding a thin adhesive film may be used to create a flat surface connection between two wafers (such as glass wafers). This form of joining technology is used especially for components that must not be exposed to higher temperatures in subsequent processing steps, for instance, because metals or biological function structures are already present that are unable to tolerate a higher temperature budget.

The at least one channel of the fluid line part must not be contaminated with adhesive during the adhesive bonding in order not to adversely affect the function of the microfluidic device. One challenge in adhesive bonding thus is the application of a homogenous large-area adhesive bonding layer on the surface of a substrate while avoiding a contamination of depressions (forming the channel(s)) of the substrate surface with the adhesive agent.

Generally, this is able to be accomplished by applying the adhesive via an adhesive transfer from a foil coated with the adhesive to a structured wafer. In the process, the foil is usually fixed in place in a frame and rolled onto the wafer surface with the aid of a roller.

However, especially flat and simultaneously broad depressions pose a problem in this technique because with a low depth-to-width ratio, is impossible to prevent a transfer of the adhesive from the foil into the depressions, with the result that the channels become contaminated. This may cause the entire microfluid device to become unusable.

To circumvent the aforementioned problem, the adhesive transfer is carried out not by rolling a foil across a large surface, but by using a spatially resolved system, for instance, using an adhesive dispenser or a type of ink-jet printing method.

U.S. Pat. No. 8,647,465 proposes an alternative solution in which adhesive is first applied to a tight-meshed grid provided with evenly spaced holes and clamped above a wafer surface, such that each hole absorbs a drop of adhesive, whereupon the underside of the grid is then brought into contact with the substrate surface, the adhesive being applied onto the substrate surface through the holes without adhesive ending up in recesses on the substrate surface.

The aforementioned methods are relatively labor-intensive and thus costly.

Example embodiments of the present invention provide providing a fluid line part for a microfluidic device that allows for a simpler material transfer within the framework of an adhesive bonding method in which a contamination of a channel of the fluid line part is prevented also in a relatively low depth-to-width ratio of the channel.

Furthermore, example embodiments of the present invention provide a corresponding microfluidic device and a corresponding production method.

According to a first aspect, a fluid line part includes at least one support web, which extends lengthwise inside the channel along the main flow direction, the support web being configured and positioned such that the fluid flows freely around it.

According to a second aspect, a microfluidic device includes a fluid line part according to the first aspect and also a sealing part, which includes a second substrate having a second surface, the second surface at least regionally being bonded to the first surface.

According to a third aspect, a method for producing a microfluidic device is provided. First, the method includes the provision of a fluid line part, which includes the following: a first substrate having a first surface in which at least one depression is provided, the at least one depression forming a channel for conducting a fluid along a main flow direction; and at least one support web around which fluid flows freely inside the channel. The method furthermore includes the application of adhesive to a first surface by rolling a foil coated with the adhesive onto the first surface, the support web preventing contact between the adhesive-coated foil with a bottom of the channel.

In the following text, reference will be made to all aforementioned aspects.

The provision of at least one support web in the channel makes it possible to prevent the functional channel from becoming contaminated with the adhesive even if the depth-to-width ratio of the channel is unfavorable (especially low) in view of an adhesive transfer with the aid of an adhesive-coated foil, that is to say, involves very flat and broad depressions. This is accomplished in that the at least one support web supports the foil during the rolling operation and thus keeps it away from the bottom of the channel.

The support webs are situated in the channel such that the flow can flow freely around them. For instance, this means that they do not divide a fluid flow into a plurality of entirely separate channels across the entire fluid line part; instead, the flow approaches the supporting web(s) inside the channel (that is to say, it/they has/have a leading edge that is directed counter to the main flow direction) so that they regionally divide the fluid flow, whereupon the fluid flow is then merged again after passing the support web(s) in the fluid channel. For example, the at least one support web may be shaped such that the fluid flows freely around it and, at most, the support web induces a negligible flow resistance to the fluid.

For example, a width of the support web that is low in comparison with the channel width (the channel width and the support web width being measured transversely to the main flow direction and thus transversely to a longitudinal extension of the support web) makes it possible to prevent any adverse effect on the fluidic properties of the channel provided in the fluid line part or to keep it to a minimum. According to example embodiments, for example, a support web width of the at least one support web amounts to maximally one-tenth the channel width of the channel in the region of the at least one support web.

The statement that the support web length extends along the main flow direction means that the support web has a larger dimension along said main flow direction than transversely to the main flow direction. In other words, a length of the support web (along the main flow direction) is greater than the support web width (transversely to the main flow direction). In example embodiments, a length-to-width ratio of the support web amounts to, for example, at least 10, at least 33, at least 50, etc.

According to example embodiments, a support web height of the at least one support web is equal to the depth of the channel. In other example embodiments, however, the support web height may also be smaller than the depth of the channel.

A ratio of the support web width to a support web height is, for example, greater than 1, greater than 2, e.g., greater than 10, etc.

According example embodiments, the at least one support web has a rounded leading edge at an end pointing counter to the main flow direction. For instance, the leading edge may have a semicircular shape in a top view of the support web (e.g., with a radius of one-half the support web width). This results in a relatively low flow resistance of the support web. The rounded leading edge may thus contribute to a free flow around the support web and consequently minimize any negative effect on the fluidic properties of the channel.

According to example embodiments, the respective other end of the support web, that is to say, the end pointing in the main flow direction, is also provided with such a rounded edge. This may contribute to a laminar flow around the support web that offers especially low resistance. For example, the rounded leading edges may reduce turbulence of the fluid in the region of the support web. In addition, such a rounded edge pointing in the main flow direction may prevent bubbles from adhering to the particular edge or make such an adherence more difficult.

According to example embodiments, two or more (for example, three) support webs of this type are provided, which extend next to one another in the channel. Even with a channel that is very broad and has a relatively low channel depth, this makes it possible to prevent contact between the foil and the bottom of the channel and a contamination by the adhesive during the adhesive transfer.

The support web(s) may be able to divide the channel into multiple subchannels of the same widths in a cross-section perpendicular to the main flow direction. The subchannels may be laterally restricted by, for instance, a side wall of the channel and a side wall of a support web, or (if at least two support webs are provided that extend next to each other) by two side walls of adjacent support webs. Through an equidistant positioning of the support web or the multiple support webs across the width of the channel, the best possible support effect is able to be achieved for the foil during the adhesive transfer so that a minimum number of such support webs will be sufficient given a specified channel width and channel depth.

With regard to the dimensions of the channel, it may be provided that a depth of the channel is smaller than or equal to 75 µm, smaller than or equal to 50 µm, smaller than or equal to 5 µm, etc.

With regard to the channel width, it may amount to at least 1.0 mm, at least 2.5 mm, at least 5.0 mm, etc.

In a relatively low depth-to-width ratio such as given by the combination of the aforementioned example embodiments (having a channel depth of less than 75 µm and a channel width of at least 2.5 mm), the absence of one or more support web(s) would pose the risk of contact between the foil and the channel bottom, and thus of a contamination of the channel by the adhesive. However, precisely this risk is prevented by the at least one support web described herein. Thus, a microfluidic device may be produced with the aid of adhesive bonding even with such broad and flat channels. For example, homogeneously joined, low-stress microfluidic components that were not exposed to any high temperatures may be obtained.

The at least one support web is, for example, arranged as one piece with the first substrate. This means that the at least one support web is able to be produced together with the channel from the first substrate, for instance.

For this purpose, a depression, which forms the channel, is, for example, produced with the aid of an etching process, the working process being carried out such that the at least one support web remains standing. For instance, photolithography techniques may be utilized for this purpose in which small structures such as the recess that is formed in the channel and also the at least one support web are able to be obtained with sufficient precision.

According to example embodiments, the method includes providing a sealing part, which includes a second substrate having a second surface, and bonding the second surface of the sealing part to the first surface of the fluid line part with the aid of the adhesive. For example, it may be provided that multiple such fluid line parts are provided on a first wafer and multiple such sealing parts are provided on a second wafer. The second wafer is bonded to the first wafer in its entirety. This makes it possible to produce multiple microfluidic devices in a single step in a particularly efficient manner. The bonded wafers are able to be separated into multiple microfluidic devices (for instance, by a sawing or laser separating process) following the bonding.

The sealing part may have an unstructured surface which is bonded to the fluid line part and seals the channel at the top simply in the manner of a cover. Alternatively, however, the surface of the sealing part may also be structured and, for example, have one or more depressions that form one or more channel(s) for the fluid. From a functional standpoint, the sealing part may therefore also be arranged for conducting a fluid just as the fluid line part. The placement of depressions in the fluid line part and the sealing part may be mutually adapted such that the depressions in the fluid line part and the depressions in the sealing part jointly form one or more channel(s) following the adhesive bonding process.

Glass, silicon and plastic are, for example, used as materials for the first substrate and/or the second substrate. Glass and silicon, for example, are suitable for the afore-described production using one or more wafers that are bonded to one another.

It should be understood that the method described herein may be directed especially toward the production of a microfluidic device as described herein. For this reason, the explanations provided in the previous and following text may similarly be applied to the microfluidic device and/or to the fluid line part, and vice versa.

Further details and aspects of example embodiments of the present invention are described in greater detail below with reference to the appended schematic Figures.

DETAILED DESCRIPTION

Figure 1:
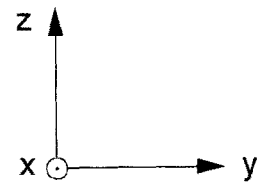
FIG. 1 schematically illustrates an adhesive transfer in a conventional fluid line part for a microfluidic device.
Figure 1:
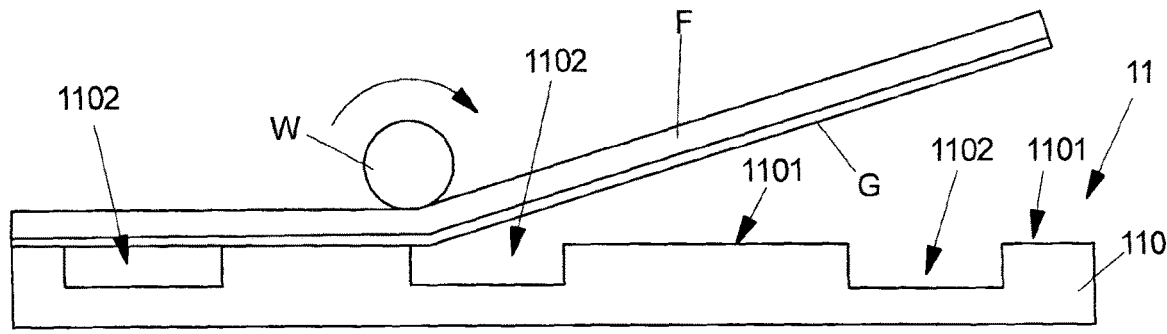
Figure 1:
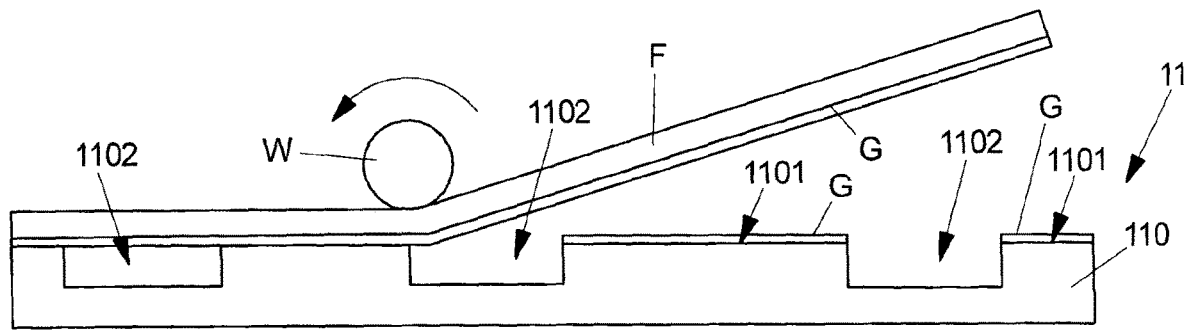

FIG. 1 schematically illustrates the process of an adhesive transfer in a conventional fluid line part 11 for a microfluidic device. Stated more precisely, a cross-sectional view of a fluid line part 11 along a direction Y is shown, which extends perpendicular to a main flow direction X in fluid line part 11.

Fluid line part 11 includes a substrate 110 in whose upper surface 1101 a plurality of depressions 1102 is provided. Depressions 1102 define channels that guide a fluid along main flow direction X.

Generally, such a fluid line part 11 is sealed by a sealing part in order to seal channels 1102 at the top. To this end, the sealing part is bonded to fluid line part 11 with the aid of adhesive bonding, for example.

As schematically illustrated in FIG. 1 in two steps, a thin adhesive film G is first transferred to structured surface 1101 using a foil F coated with adhesive G. Foil F, fixed in place in a frame, is rolled onto surface 1101 with the aid of a roller W (rolling movement of roller W to the right in the upper part of FIG. 1), so that the different coplanar sections of surface 1101 are wetted with adhesive G. Then, foil F is removed (rolling movement of roller W to the left in the lower part of FIG. 1) so that a thin adhesive film G is exposed on surface 1101. The sealing part can then be glued to this adhesive film.

Figure 2:
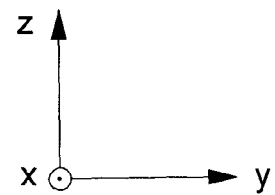
FIG. 2 schematically illustrates an adhesive transfer in a conventional fluid line part for a microfluidic device in which contamination of a fluid channel with an adhesive occurs.
Figure 2:
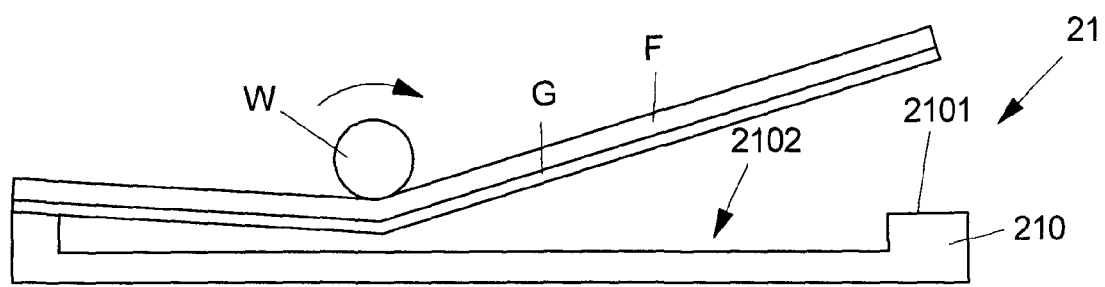
Figure 2:
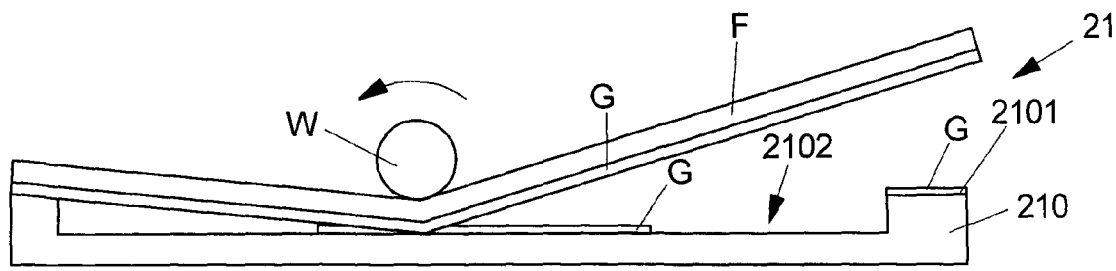

FIG. 2 shows the foregoing process of the adhesive transfer in a different fluid line part 21. In comparison with the substrate from FIG. 1, substrate 210 of fluid line part 21 from FIG. 2 has a considerably broader depression 2102 relative to surface 2101 (with a depth similar to that in FIG. 1). This has the result that foil F is pressed onto the bottom of the channel formed by depression 2102 during the rolling process, so that the channel is contaminated with adhesive G as illustrated in the lower part of FIG. 2. This could render the entire microfluidic device unusable and should therefore be avoided.

Figure 3:
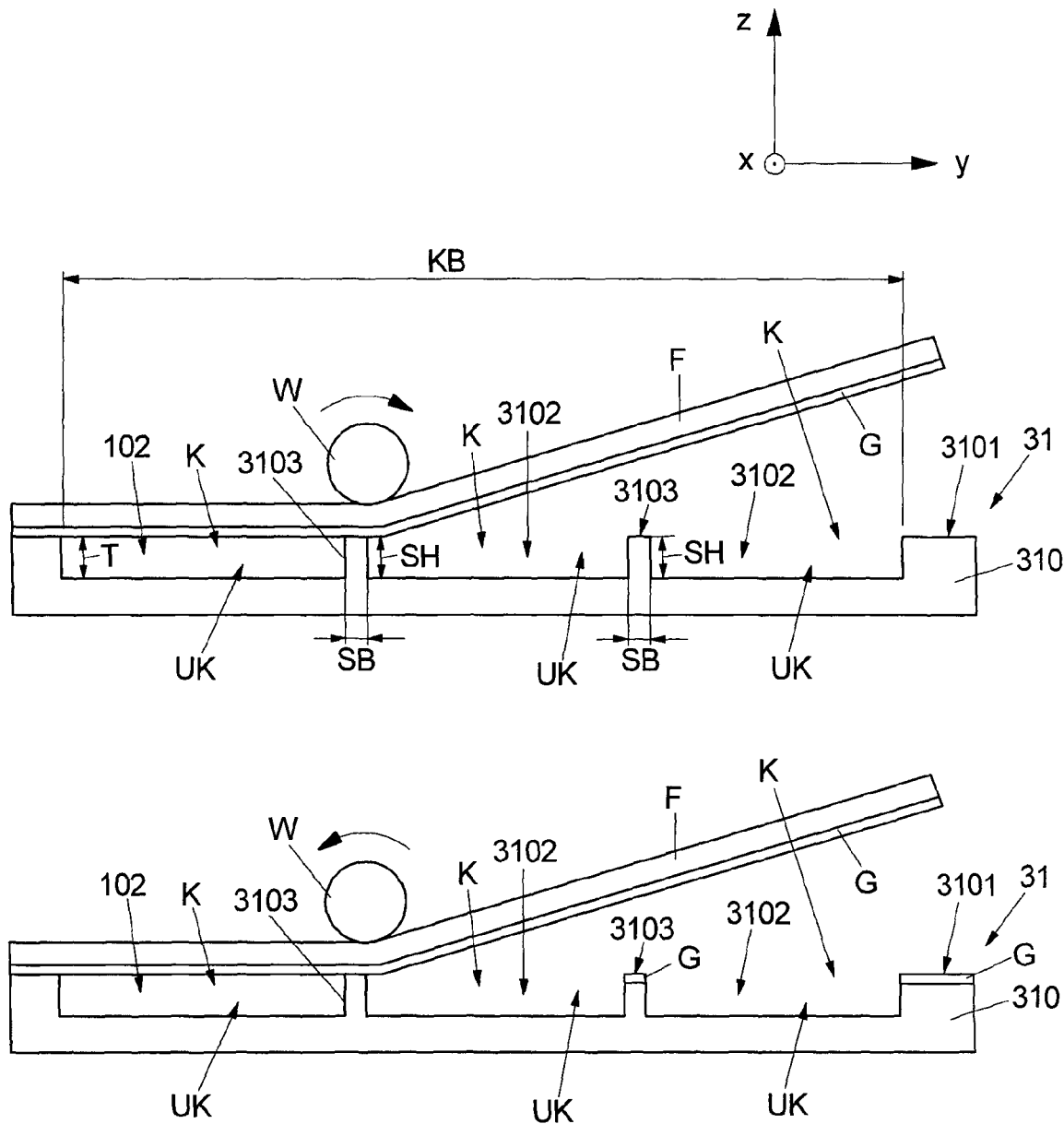
FIG. 3 schematically illustrates an adhesive transfer in a fluid line part for a microfluidic device according to an example embodiment of the present invention.

FIG. 3 schematically illustrates an adhesive transfer in a fluid line part 31 for a microfluidic device 3 according to an example embodiment of the present invention, which solves the problem described earlier with reference to FIG. 2.

Fluid line part 31 includes a first substrate 310, which may be made from glass, silicon, or plastic. Depressions 3102 are provided in a first surface 3101 of substrate 310, which jointly form a channel K having a channel width KB. Channel K defines a main flow direction X for a fluid.

Two support webs 3103, which extend lengthwise along main flow direction X, are situated in channel K. When adhesive G is applied to the different coplanar sections of first surface 3101 when foil F coated with adhesive G is applied by a roll-on process, the support webs prevent contact between adhesive G and the bottom of channel K.

In the illustrated exemplary embodiment, support webs 3103 are arranged in one piece with first substrate 310. Stated differently, support webs 3103 are formed in one piece together with channel K from first substrate 103, for instance, by a photolithographic etching method in which depressions 3102 are defined such that support webs 3103 remain standing. Such methods may be utilized especially in a substrate 310 made from glass or silicon, such as in the form of a wafer.

The cross-sectional view in FIG. 3 schematically illustrates that a particular support web width SB of support webs 3103 amounts to only a fraction of total channel width KB of channel K (at least in the region of support webs 3103). It should be noted, however, that the Figures should not be considered to be true to scale with regard to the dimensions; instead, they are simply meant to illustrate the structures and relations in the illustrated exemplary embodiments in qualitative terms.

In the exemplary embodiment illustrated in FIG. 3, the respective support web width SB amounts to less than one-tenth the channel width KB. The small support web width SB compared with channel width KB makes it possible to prevent or minimize any negative effect on the fluidic properties of channel K provided in fluid line part 31.

Because of support webs 3103, an adhesive transfer with the aid of a foil F is able to take place without contaminating channel K with adhesive during the unrolling of foil F even given a relatively large channel width KB and at the same time a relatively low channel depth T, as schematically illustrated in FIG. 3.

In the example embodiment illustrated in FIG. 3, for instance, channel depth T may be smaller than or equal to 75 μm, smaller than or equal to 50 μm, smaller than or equal to 5 μm. Channel width KB, on the other hand, may amount to at least 2.5 mm. For instance, channel width KB may amount to 2.5 mm at a channel depth of 50 μm.

A support web height SH of support webs 3103 is equal to channel depth T. In other example embodiments, however, support web height SH may also be smaller than channel depth T.

Figure 4:
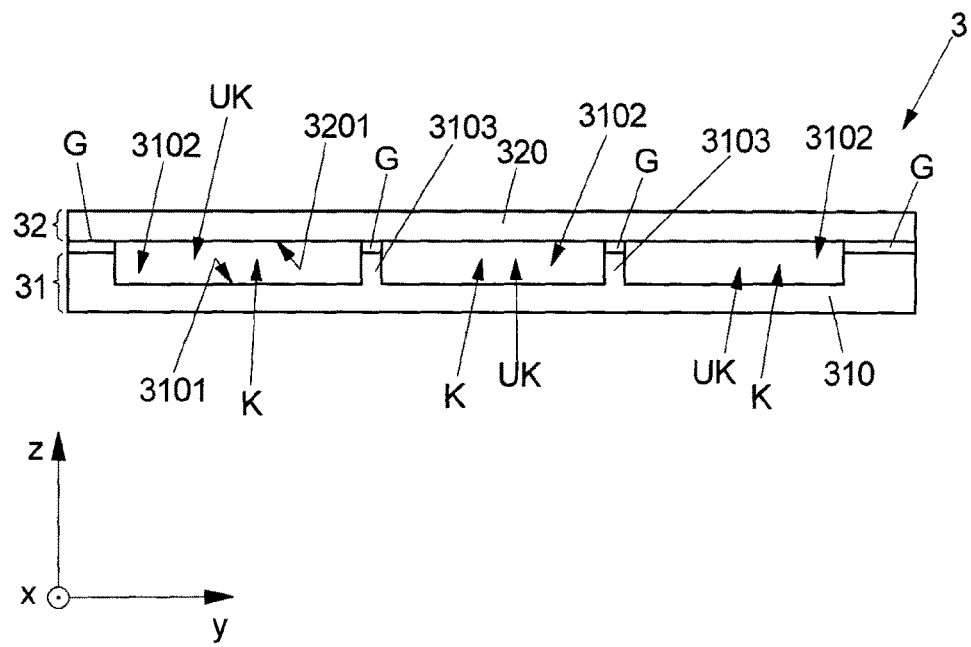
FIG. 4 schematically illustrates an example embodiment of a microfluidic device having a fluid line part and a sealing part bonded thereto.

FIG. 4 schematically illustrates an example embodiment of a microfluidic device 3 having fluid line part 31 illustrated in FIG. 3 and also a sealing part 32 bonded thereto, which seals channel K at the top. Second surface 3201 of a second substrate 320 is bonded to the coplanar sections of first surface 310 (to which surface sections of support webs 3103 belong as well) which are wetted with adhesive G in the adhesive transfer step illustrated in FIG. 3.

For example, microfluidic device 3 illustrated in FIG. 4 may be produced such that multiple such fluid line parts 31 are initially provided on a first wafer and multiple such sealing parts 32 are produced on a second wafer, whereupon the second wafer as a whole is bonded to the first wafer. Multiple such microfluidic devices 3 are able to be produced in one step in this particularly efficient manner. The separation of the wafers bonded to one another into multiple microfluidic devices (for instance, by a sawing or laser-separation process) may be carried out only after the adhesive bonding, for instance.

The exemplary embodiment illustrated in FIG. 4 also shows that support webs 3103 divide channel K into three subchannels UK of equal width in a cross-section perpendicular to main flow direction X. Two outer subchannels UK are laterally restricted by a side wall of channel K and an (outer) side wall of a support web 3103 in each case, and an inner subchannel UK is laterally restricted by two (inner) side walls of adjacent support webs 3103. Because of the equidistant positioning of the support webs across the width of channel K (that is to say, along direction Y transversely to main flow direction X), the best possible support effect is able to be achieved for foil F during the adhesive transfer, so that—given a predefined channel width KB and channel depth T—it is possible to manage with the lowest number of such support webs 3103 (i.e., only two in this instance).

Figure 5:
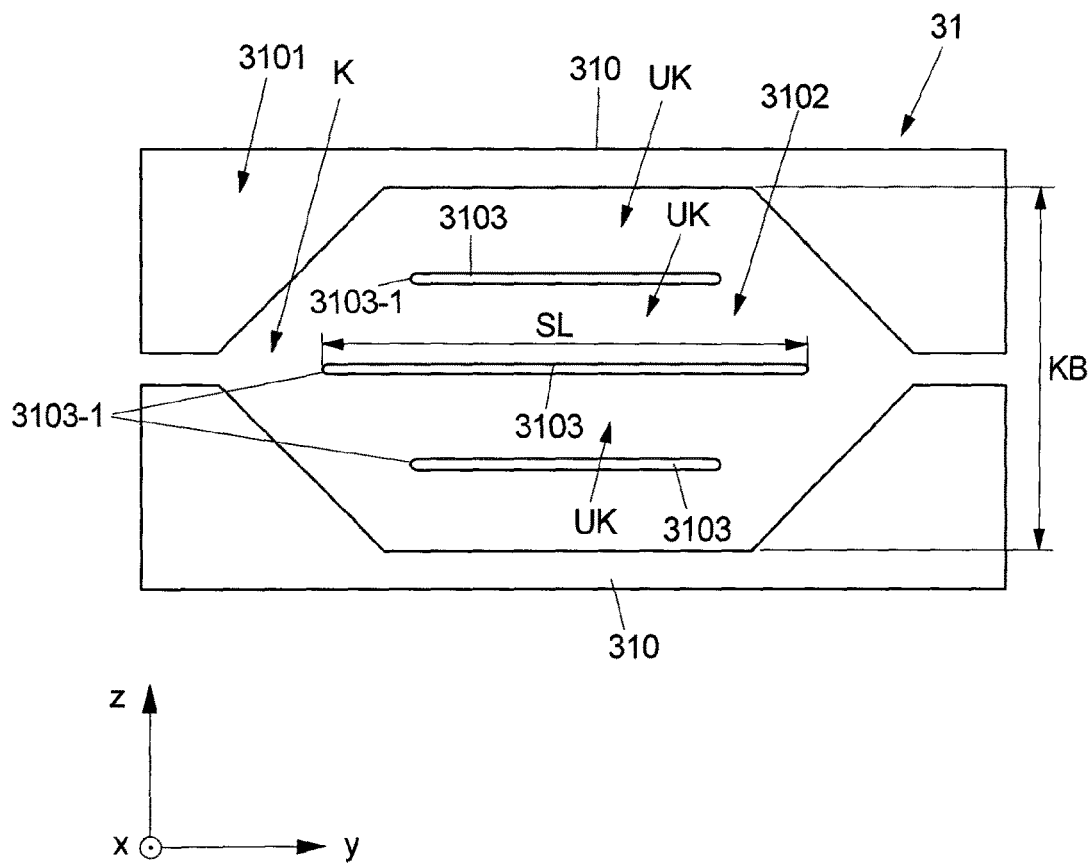
FIG. 5 is a schematic top view of a fluid line part according to an example embodiment of the present invention.

FIG. 5 schematically illustrates a further example embodiment of a fluid line part 31 in a top view. This example embodiment, for instance, may largely correspond to the example embodiment described with reference to FIGS. 3 and 4, with the difference that three adjacently extending support webs 3103 are provided in this instance.

Similar to that described with reference to FIG. 4, three support webs 3103 divide channel K into multiple (in this case, four) subchannels UK of equal width in a cross-section transversely to main flow direction X.

The top view of FIG. 5 also illustrates that a respective support web length SL (along main flow direction X) is considerably larger than support web width SB (transversely to the main flow direction, i.e., along direction Y). For instance, a length-to-width ratio of support webs 3103 may amount to, for example, at least 10, at least 33, at least 50, etc.

In relation to the example embodiment illustrated in FIG. 5, exemplary dimensions may be, for example, such that with a length of channel K of 10 mm, channel depth T amounts to 25 μm. Support web width SB, for instance, may be 0.2 mm, and the three support webs 3103 may extend next to and at a distance of 2.2 mm from one another or from the channel walls.

At an end pointing counter to main flow direction X, support webs 3103 have a rounded leading edge 3103-1, which is arranged in the shape of a semicircle at one-half the support web width SB (i.e., 0.1 mm, for instance) as a radius in a top view. This makes it possible to achieve a relatively low flow resistance of support webs 3103. Rounded leading edges 3103-1 thus are able to contribute to a free flow around support webs 3103 without any significant negative effect on the fluidic properties of channel K.

In the example embodiment illustrated in FIG. 5, the respective other end of support webs 3103, i.e., the end pointing in main flow direction X, is also provided with such a rounded leading edge. This may contribute to a laminar flow around support webs 3103 that offers low resistance. Especially turbulence of the fluid or the adhesion of air bubbles when fluid enters the region of support webs 3103 is able to be avoided with the aid of rounded leading edges.

LIST OF REFERENCE CHARACTERS 11 fluid line part
110 substrate
1101 surface
1102 depression
21 fluid line part
210 substrate
2101 surface
2102 depression
31 fluid line part
310 first substrate
3101 first surface
3102 depression
3103 support web
3103-1 leading edge
32 sealing part
320 second substrate
3201 second surface
B bottom of the channel
F foil
G adhesive
K channel
KB channel width
SB support web width
SL support web length
SH support web height
T channel depth
UK subchannel
W roller
X main flow direction

The invention claimed is:

1. A fluid line part for a microfluidic device, comprising:
a first substrate having a first surface, at least one depression being formed in the first surface and forming a channel adapted to conduct a fluid along a main flow direction; and
at least one support web extending lengthwise inside the channel along the main flow direction, the support web being configured and positioned such that fluid is freely flowable around the support web;
wherein the support web has a rounded leading edge at an end pointing counter to the main flow direction, a radius of the rounded leading edge corresponding to half a width of the support web as viewed from a direction normal to the first surface.

2. The fluid line part according to claim 1, wherein a support web width of the support web amounts to a maximum of one-tenth a channel width of the channel in a region of the support web.

3. The fluid line part according to claim 1, wherein the support web is integral with the first substrate.

4. The fluid line part according to claim 1, wherein the at least one support web includes a plurality support webs extending lengthwise next to one another in the channel.

5. The fluid line part according to claim 1, wherein the support web divides the channel into multiple subchannels having an equal cross-sectional width perpendicular to the main flow direction.

6. The fluid line part according to claim 4, wherein the support webs divide the channel into multiple subchannels having an equal cross-sectional width perpendicular to the main flow direction.

7. The fluid line part according to claim 1, wherein a channel depth of the channel is less than or equal to 75 µm.

8. The fluid line part according to claim 1, wherein a channel width of the channel is at least 1.0 mm.

9. The fluid line part according to claim 1, wherein a ratio of a support web width of the support web to a support web height of the support web is greater than 1.

10. The fluid line part according to claim 1, wherein the first substrate is formed of glass, silicon, and/or plastic.

11. The fluid line part according to claim 1, wherein the at least one support web includes a plurality of support webs, a first one of the support webs having a support web length in the main flow direction that is different than that a support web length of a second one of the support webs.

12. The fluid line part according to claim 1, wherein a ratio of a support web width of the support web to a support web height of the support web is greater than 2 and/or greater than 10.

13. The fluid line part according to claim 1, wherein a length-to-width ratio of the support webs is at least 10, at least 33, and/or at least 50.

14. The fluid line part according to claim 1, wherein a support web height of the support web is equal to a depth of the channel.

15. A microfluidic device, comprising:
a fluid line part as recited in claim 1; and
a sealing part including a second substrate having a second surface, the second surface being at least regionally bonded to the first surface.

16. A method for producing a microfluidic device, comprising:
applying an adhesive onto the first surface of a fluid line part recited in claim 1 by unrolling a foil, coated with the adhesive, on the first surface, the support web preventing contact between the foil coated with the adhesive and a bottom of the channel.

17. The method according to claim 16, further comprising:
bonding a second surface of a second substrate of a sealing part to the first surface of the fluid line part with the aid of the adhesive.

18. The method according to claim 17, wherein a plurality of the fluid line part are provided on a first wafer and a plurality of the sealing part are provided on a second wafer, and the second wafer is bonded to the first wafer.

19. The method according to claim 16, further comprising producing the fluid line part including integrally forming the support web and the first substrate.

20. The fluid line part according to claim 1, wherein the radius of the rounded leading edge corresponding to half the width of the support web as viewed from the direction normal to the first surface and orthogonal to the main flow direction.

21. The fluid line part according to claim 1, wherein the support webs are adapted to support a sealing part of the microfluidic device above a bottom surface of the channel.

22. The fluid line part according to claim 1, wherein the support webs support a sealing part of the microfluidic device above a bottom surface of the channel.

* * * * *